United States Patent
Aoike

(10) Patent No.: US 7,880,511 B2
(45) Date of Patent: Feb. 1, 2011

(54) MOS INTEGRATED CIRCUIT AND ELECTRONIC EQUIPMENT INCLUDING THE SAME

(75) Inventor: Masahiro Aoike, Kyoto (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 12/402,085

(22) Filed: Mar. 11, 2009

(65) Prior Publication Data

US 2009/0243662 A1 Oct. 1, 2009

(30) Foreign Application Priority Data

Mar. 26, 2008 (JP) .............................. 2008-080873

(51) Int. Cl.
*H03F 3/45* (2006.01)
(52) U.S. Cl. ........................................ 327/103; 327/63
(58) Field of Classification Search .................. 327/63, 327/103
See application file for complete search history.

(56) References Cited

U.S. PATENT DOCUMENTS

| 4,377,789 A | | 3/1983 | Hoover |
| 4,524,328 A | | 6/1985 | Abou et al. |
| 5,477,170 A | * | 12/1995 | Yotsuyanagi ................. 327/66 |
| 5,696,400 A | | 12/1997 | Yoshida et al. |
| 5,847,598 A | * | 12/1998 | Sone .......................... 327/563 |
| 6,551,884 B2 | * | 4/2003 | Masuoka .................... 438/275 |
| 6,828,832 B2 | * | 12/2004 | Gabillard .................... 327/103 |
| 7,233,174 B2 | * | 6/2007 | Martins ....................... 327/65 |
| 7,274,916 B2 | * | 9/2007 | Al-Shyoukh et al. ........ 455/130 |
| 2005/0104628 A1 | * | 5/2005 | Tanzawa et al. ............... 327/63 |

FOREIGN PATENT DOCUMENTS

| JP | 05-259841 | 10/1993 |
| JP | 07-302842 | 11/1995 |

* cited by examiner

*Primary Examiner*—Lincoln Donovan
*Assistant Examiner*—William Hernandez
(74) *Attorney, Agent, or Firm*—McDermott Will & Emery LLP

(57) ABSTRACT

A MOS integrated circuit includes: a voltage-to-current conversion circuit configured to convert first and second voltages to a first current having a current value corresponding to the first voltage and a second current having a current value corresponding to the second voltage; and a current comparison circuit configured to compare the respective current values of the first and second currents and to output a voltage showing the comparison result. Oxide films of MOS transistors of the current comparison circuit are thinner than oxide films of MOS transistors of the voltage-to-current conversion circuit.

8 Claims, 10 Drawing Sheets

MOS INTEGRATED CIRCUIT AND ELECTRONIC EQUIPMENT INCLUDING THE SAME

CROSS REFERENCE TO RELATED APPLICATION

This application claims priority under 35 U.S.C. §119 on Patent Application No. 2008-080873 filed in Japan on Mar. 26, 2008, the entire contents of which are hereby incorporated by reference.

BACKGROUND OF THE INVENTION

1. Field of the Invention

The present invention relates to a MOS (Metal Oxide Semiconductor) integrated circuit of a comparator, and an electronic equipment including the MOS integrated circuit.

2. Related Art

A conventional comparator has, for example, a structure as shown in FIG. 14. The comparator shown in FIG. 14 includes a current source 10, P-channel MOS transistors 11, 12 respectively receiving a differential voltage Vin, Vin', N-channel MOS transistors 13, 14, and a buffer 15. The transistors of the comparator (i.e., the P-channel MOS transistors 11, 12, the N-channel MOS transistors 13, 14, and transistors of the buffer 15) have a gate oxide film of the same thickness.

SUMMARY OF THE INVENTION

In the above conventional structure, the transistors of the comparator have a thick gate oxide film so that the comparator can be resistant to a high-voltage input from outside. However, such a thick gate oxide film increases variation in characteristics of the transistors. The transistors therefore have a large gate area in order to suppress the variation. This structure increases the circuit area and the length of wirings provided therein, resulting in increased power consumption in high speed operation. Such increased power consumption is particularly problematic when the comparator is mounted in a battery-operated portable equipment.

In view of the above, it is an object of the present invention to reduce power consumption in high speed operation of a comparator.

In order to achieve the above object, according to the invention, a MOS integrated circuit for comparing respective voltage values of first and second voltages includes: a voltage-to-current conversion circuit configured to convert the first and second voltages to a first current having a current value corresponding to the first voltage and a second current having a current value corresponding to the second voltage; and a current comparison circuit configured to compare the respective current values of the first and second currents and to output a voltage showing the comparison result. Oxide films of MOS transistors of the current comparison circuit are thinner than oxide films of MOS transistors of the voltage-to-current conversion circuit.

Forming the voltage-to-current conversion circuit by MOS transistors having a thick gate oxide film enables durability to high voltage input (the first and second voltages) to be maintained. At the same time, forming the current comparison circuit by MOS transistors having a thin gate oxide film enables reduction in circuit area. Since the circuit area is reduced, the length of wirings provided therein can be reduced, enabling reduction in power consumption in high speed operation.

DETAILED DESCRIPTION OF THE PREFERRED EMBODIMENTS

Figure 1:
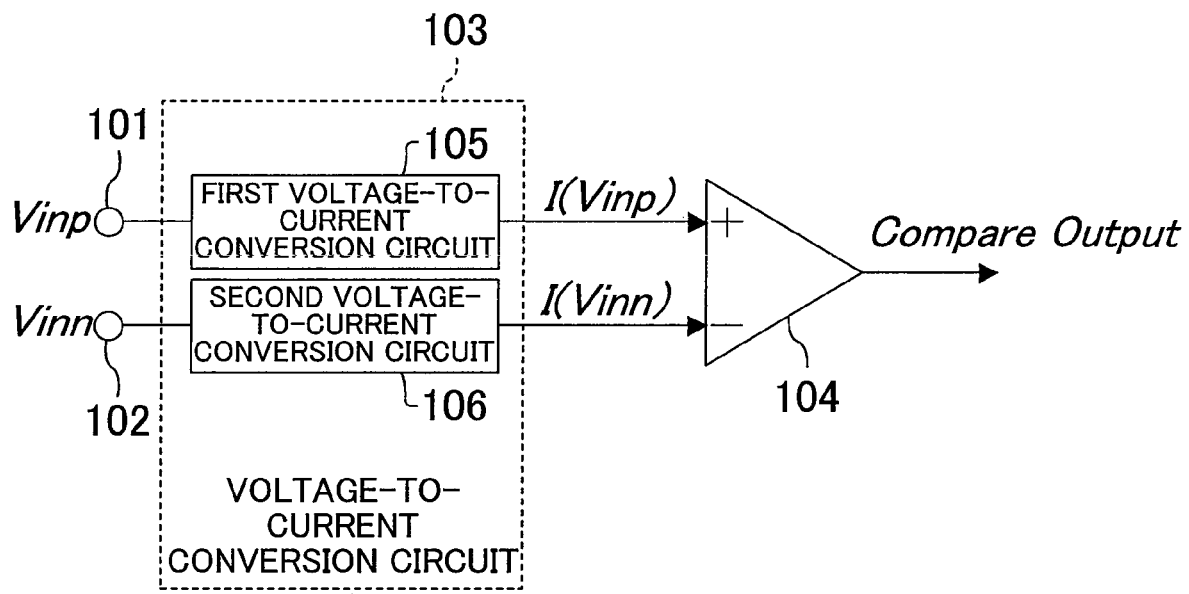
FIG. 1 is a circuit diagram showing a structure of a comparator according to a first embodiment.

Hereinafter, embodiments of the present invention will be described with reference to the accompanying drawings. Note that, in the following embodiments, elements having like functions are denoted by the same reference numerals and characters and description thereof will be omitted.

First Embodiment

As shown in FIG. 1, a comparator according to a first embodiment of the present invention includes a first input terminal 101, a second input terminal 102, a voltage-to-current conversion circuit 103, and a current comparison circuit 104, and is formed by a MOS integrated circuit.

A first voltage Vinp is applied to the first input terminal 101 and a second voltage Vinn is applied to the second input terminal 102. The first voltage Vinp and the second voltage Vinn are input from outside of an LSI including the comparator (the MOS integrated circuit).

The voltage-to-current conversion circuit 103 converts the first voltage Vinp applied to the first input terminal 101 to a first current I(Vinp), and converts the second voltage Vinn applied to the second input terminal 102 to a second current I(Vinn). More specifically, the voltage-to-current conversion circuit 103 includes a first voltage-to-current conversion circuit 105 and a second voltage-to-current conversion circuit 106.

Figure 2:
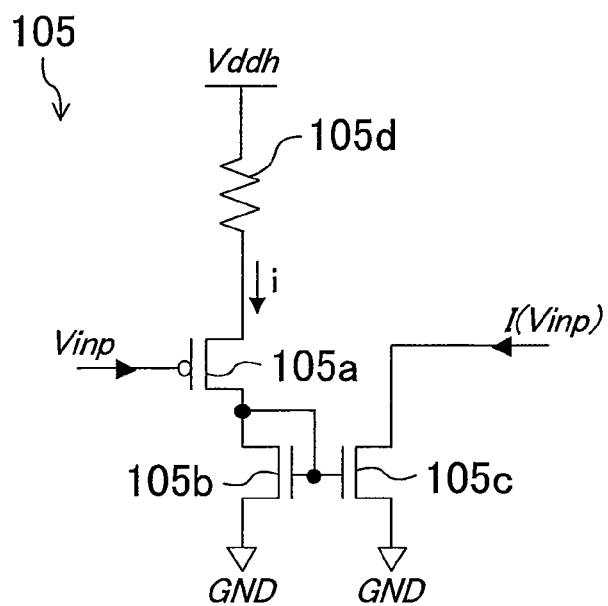
FIG. 2 is a circuit diagram showing a structure of a first voltage-to-current conversion circuit 105 according to the first embodiment.

As shown in FIG. 2, the first voltage-to-current conversion circuit 105 includes a P-channel MOS transistor 105a, N-channel MOS transistors 105b, 105c, and a resistive element 105d.

The P-type MOS transistor 105a can be considered as a source follower circuit. The P-channel MOS transistor 105a has a sufficiently large Gm (a gradient of a drain current with respect to a gate-source voltage). A current value Id of a current i flowing between the source and drain of the P-type MOS transistor 105a is determined by a threshold voltage Vt of the P-channel MOS transistor 105a and a resistance value R of the resistive element 105d. More specifically, provided that ΔVin is a variation in the input voltage Vinp, a variation ΔId in the current value Id can be obtained by ΔId=ΔVin/R. Since the N-channel MOS transistors 105b and 105c form a current mirror circuit, a current having the current value Id flows through the N-channel MOS transistor 105c as the first current I(Vinp). Conversion efficiency of converting the first voltage Vinp to the current I(Vinp) is therefore determined by the resistance value R of the resistive element 105d.

The second voltage-to-current conversion circuit 106 has the same structure as that of the first voltage-to-current conversion circuit 105 except that the second voltage-to-current conversion circuit 106 converts the second voltage Vinn to the second current I(Vinn) instead of converting the first voltage Vinp to the first current I(Vinp).

A resistive element having a variable resistance value R may be used as the resistive element 105d. In this case, voltage-to-current conversion efficiency can be varied by varying the resistance value R of the resistive element. Accordingly, even when the differential input voltages, that is, the first and second voltages Vinp, Vinn, change in amplitude, the first and second currents I(Vinp), I(Vinn) can be maintained at optimal current values for comparison operation of the current comparison circuit 104 described below.

The current comparison circuit 104 compares the respective current values of the first current I(Vinp) generated by the first voltage-to-current conversion circuit 105 and the second current I(Vinn) generated by the second voltage-to-current conversion circuit 106 and outputs a voltage showing the comparison result.

Figure 3:
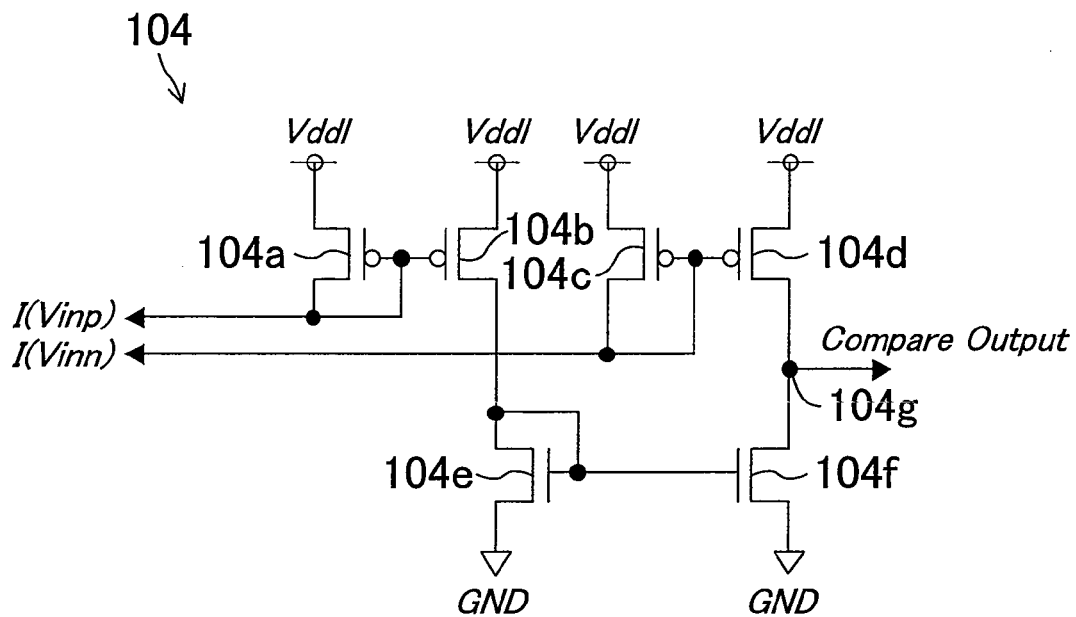
FIG. 3 is a circuit diagram showing a structure of a current comparison circuit 104 according to the first embodiment.

As shown in FIG. 3, the current comparison circuit 104 includes P-channel MOS transistors 104a through 104d and N-channel MOS transistors 104e, 104f. The P-channel MOS transistors 104a through 104d have their respective sources connected to a power supply Vddl, and the N-channel MOS transistors 104e, 104f have their respective sources connected to the ground GND. The P-channel MOS transistor 104d and the N-channel MOS transistor 104f have their respective drains connected to each other. The current comparison circuit 104 outputs a voltage of a node 104g between the P-channel MOS transistor 104d and the N-channel MOS transistor 104f as the comparison result (Compare Output). Gate oxide films of the MOS transistors (the P-channel MOS transistors 104a through 104d and the N-channel MOS transistors 104e, 104f) in the current comparison circuit 104 are thinner than those of the MOS transistors (the P-channel MOS transistor 105a and the N-channel MOS transistors 105b, 105c) of the voltage-to-current conversion circuit 103. Accordingly, provided that the MOS transistors have the same gate area, variation in characteristics of the MOS transistors of the current comparison circuit 104 is smaller than that of the MOS transistors of the voltage-to-current conversion circuit 103.

The first current I(Vinp) flows between the drain and source of the P-channel MOS transistor 104a. Since the P-channel MOS transistor 104a and the P-channel MOS transistor 104b form a current mirror circuit, a current having the same value as the first current I(Vinp) flows through the P-channel MOS transistor 104b. Moreover, since the N-channel MOS transistor 104e and the N-channel MOS transistor 104f form a current mirror circuit, a current having the same value as the first current I(Vinp) flows through the N-channel MOS transistor 104f.

On the other hand, the second current I(Vinn) flows between the drain and source of the P-channel MOS transistor 104c. Since the P-channel MOS transistor 104c and the P-channel MOS transistor 104d form a current mirror circuit, a current having the same value as the second current I(Vinn) flows through the P-channel MOS transistor 104d.

By switching between a first state in which the first voltage Vinp is at a predetermined H level and the second voltage Vinn is at a predetermined L level, and a second state in which the first voltage Vinp is at a predetermined L level and the second voltage Vinn is at a predetermined H level, the comparison result (Compare Output) can be switched between the voltage of the ground GND and the voltage of the power supply Vddl.

More specifically, in the first state, the first voltage Vinp is at the predetermined H level and the second voltage Vinn is at the predetermined L level. A current flowing through the N-channel MOS transistor 104f therefore becomes larger than that flowing through the P-channel MOS transistor 104d. The voltage of the ground GND is therefore output as the comparison result.

In the second state, on the other hand, the first voltage Vinp is at the predetermined L level and the second voltage Vinn is at the predetermined H level. A current flowing through the P-channel MOS transistor 104d therefore becomes larger than that flowing through the N-channel MOS transistor 104f. The voltage of the power supply Vddl is therefore output as the comparison result.

According to the present embodiment, since the voltage-to-current conversion circuit 103 is formed by the MOS transistors having a sufficiently thick gate oxide film, durability to high voltage input (the first and second voltages Vinp, Vinn) can be maintained. At the same time, since the current comparison circuit 104 is formed by the MOS transistors having a thin gate oxide film, the circuit area can be reduced. This structure facilitates mounting of the comparator of the present embodiment performing an analog operation on an integrated circuit having a digital circuit mounted thereon. When a digital circuit and the comparator of the present embodiment are to be mounted in an electronic equipment, mounting the digital circuit and the comparator on a common integrated circuit can reduce the number of parts of the electronic equipment as compared to the case of mounting the digital circuit and the comparator on separate integrated circuits. Since the circuit area can be reduced, the length of wirings provided therein can be reduced, enabling reduction in power consumption in high speed operation.

Second Embodiment

Figure 4:
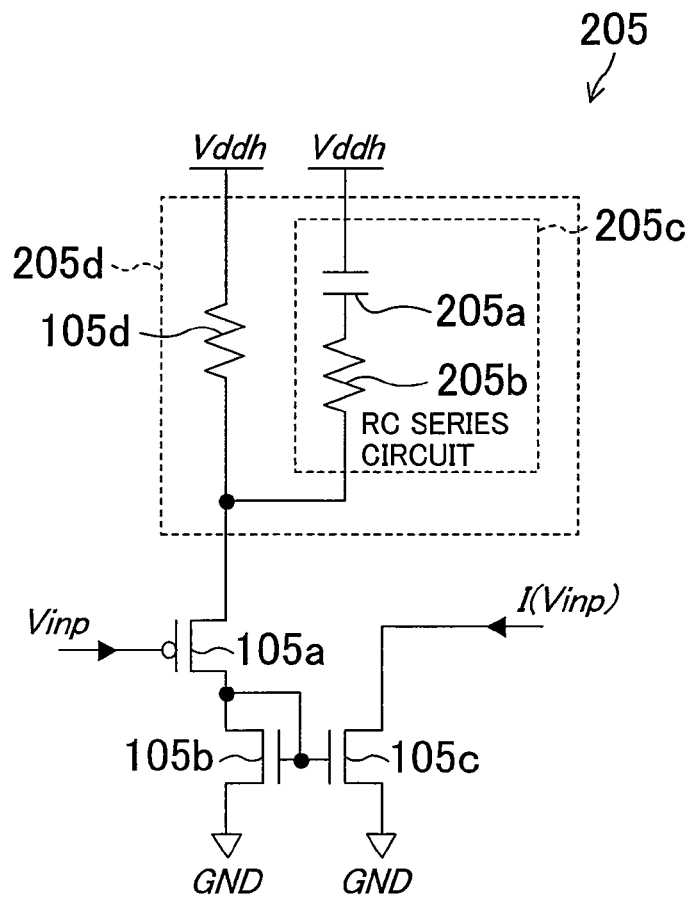
FIG. 4 is a circuit diagram showing a structure of a first voltage-to-current conversion circuit 205 according to a second embodiment.

A comparator according to a second embodiment of the present invention includes a first voltage-to-current conversion circuit 205 shown in FIG. 4 instead of the first voltage-to-current conversion circuit 105 of the first embodiment. The first voltage-to-current conversion circuit 205 further includes an RC (Resistor-Capacitor) series circuit 205c in addition to the structure of the first voltage-to-current conversion circuit 105. A capacitor 205a and a resistive element 205b are connected in series with each other in the RC series circuit 205c.

Provided that the capacitor 205a has capacitance C and the resistive element 205b has a resistance value r, the impedance z of the RC series circuit 205c is expressed by the following formula:

$$z = r + \frac{1}{j\omega C}$$

The impedance Z of a circuit 205d including the RC series circuit 205c and the resistive element 105d can be described by the following formula:

$$\frac{1}{Z} = \frac{1}{R} + \frac{1}{r + \frac{1}{j\omega C}}$$

Figure 5:
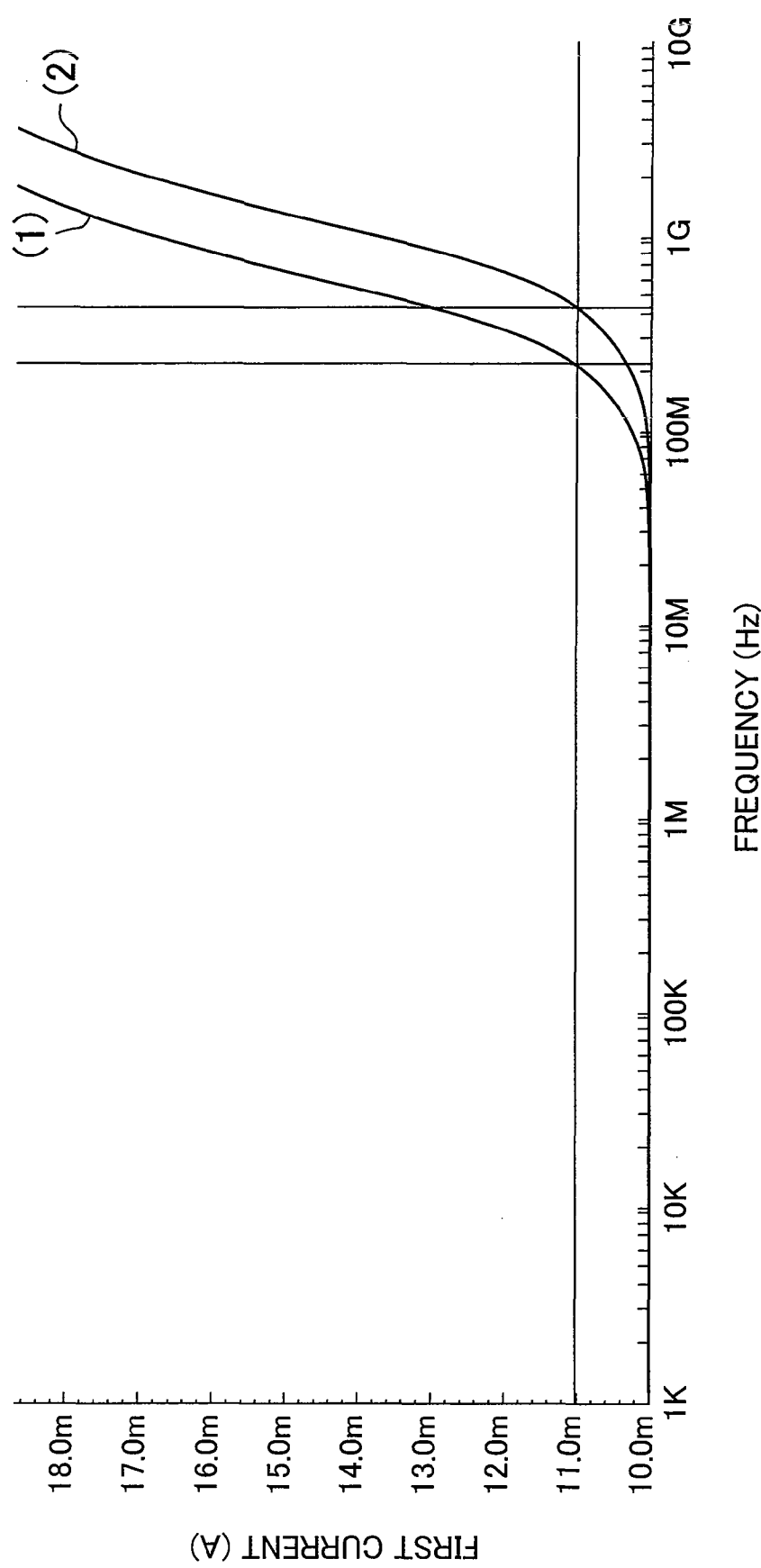
FIG. 5 is a graph showing a relation between a frequency of a first voltage and a first current according to the second embodiment.

The conversion efficiency of the first voltage-to-current conversion circuit 205, that is, the efficiency of converting the first voltage Vinp to the first current I(Vinp) is proportional to 1/Z. Accordingly, when the first voltage Vinp is constant, the current amount of the first current I(Vinp) increases with increase in frequency ($2\pi\omega$) of the first voltage Vinp, as shown in FIG. 5. Note that, although not shown in FIG. 5, since the capacitor impedance is $1/j\omega C$, the current amount of the first current I(Vinp) will finally converge to a value obtained when the resistive element 205b is connected in parallel with the resistive element 105d, as the frequency of the first voltage Vinp increases.

In the comparator of the present embodiment, the second voltage-to-current conversion circuit 106 has the same structure as that of the first voltage-to-current conversion circuit 205.

In general, a signal tends to degrade in a transmission path to the comparator as a frequency increases. According to the present embodiment, however, the conversion efficiency of the voltage-to-current conversion circuit 103 increases with increase in the input frequency of the first and second voltages Vinp, Vinn. Such degradation in the transmission path can therefore be corrected, whereby the overall frequency characteristics of the system can be flattened. Intersymbol interference and the like can therefore be prevented without the need to provide an equalizer or the like.

Note that the structure of the circuit 205d is not limited to that shown in FIG. 4. The circuit 205d may have another structure as long as the first current I(Vinp) obtained when a constant first voltage Vinp is applied to the first input terminal 101, that is, the conversion efficiency, can be increased with increase in frequency as shown in (1) and (2) of FIG. 5.

A capacitor having variable capacitance C may be used as the capacitor 205a. For example, in the case where signal degradation in the transmission path starts to increase at a relatively low frequency, the capacitance C of the capacitor is set so that the relation shown in (1) of FIG. 5 is obtained between the frequency of the first voltage Vinp and the current amount of the first current I(Vinp). When signal degradation starts to increase at a relatively high frequency, on the other hand, the capacitance C can be set so that the relation shown in (2) of FIG. 5 is obtained. By thus varying the capacitance C of the capacitor, the frequency at which the conversion efficiency reaches a common predetermined level can be changed. For example, in (1) of FIG. 5, the current amount increases by 10% as compared to DC (Direct Current) input at about 220 MHz. In (2) of FIG. 5, on the other hand, the current amount increases by 10% as compared to DC input at about 440 MHz. For example, the capacitor having variable capacitance C may be formed by connecting a plurality of capacitors in parallel or series with each other and providing a switch or the like for switching combination of effective capacitors.

Figure 6:
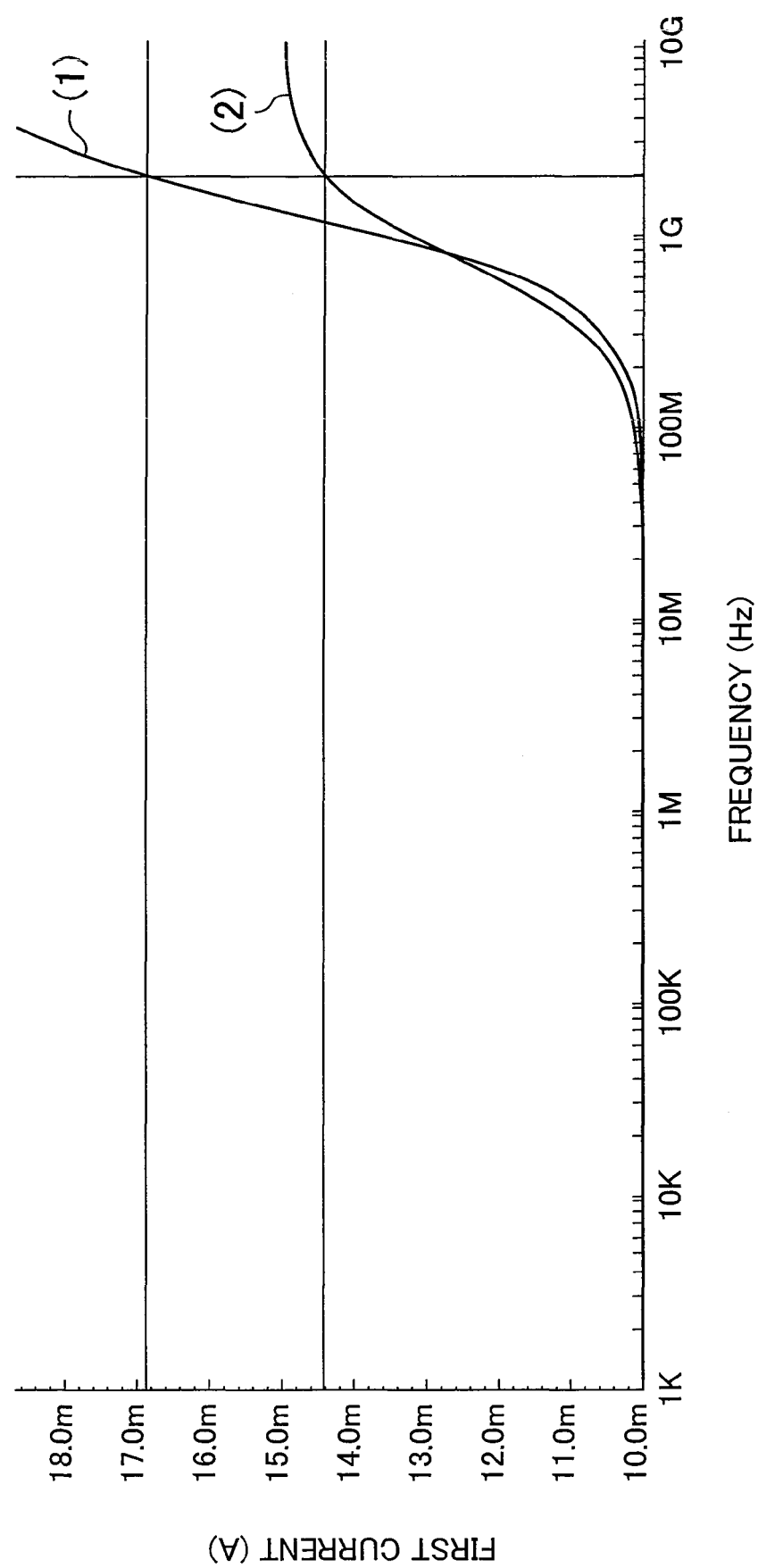
FIG. 6 is a graph showing a relation between a frequency of a first voltage and a first current according to the second embodiment.

A resistive element having a variable resistance value r may be used as the resistive element 205b. By varying the resistance value r, the gradient of the graph, that is, the increase rate of the conversion efficiency with respect to the frequency, can be varied as shown in, for example, (1) and (2) of FIG. 6. For example, the resistive element having a variable resistance value r may be formed by connecting a plurality of resistive elements in parallel or series with each other and providing a switch or the like for switching combination of effective resistive elements.

A capacitor having variable capacitance C and a resistive element having a variable resistance value r may be used as the capacitor 205a and the resistive element 205b. This enables the first and second currents I(Vinp), I(Vinn) to be appropriately corrected according to various transmission paths.

Third Embodiment

Figure 7:
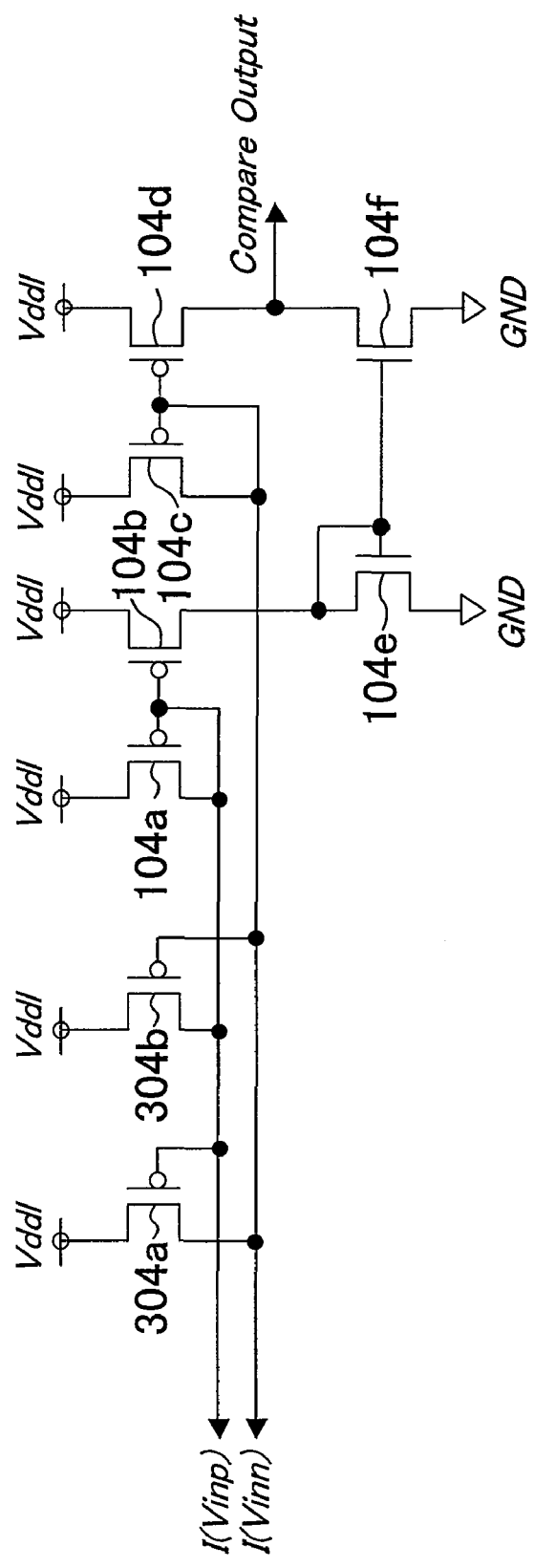
FIG. 7 is a circuit diagram showing a structure of a current comparison circuit 304 according to a third embodiment.

A comparator according to a third embodiment of the present invention includes a current comparison circuit 304 instead of the current comparison circuit 104 of the first embodiment. The current comparison circuit 304 has hysteresis characteristics in the relation between the difference in current value between the first and second currents I(Vinp), I(Vinn) and the voltage (output voltage) to be output as the comparison result. More specifically, as shown in FIG. 7, the current comparison circuit 304 further includes P-channel MOS transistors 304a, 304b in addition to the structure of the current comparison circuit 104. Like the other MOS transistors (the P-channel MOS transistors 104a through 104d and the N-channel MOS transistors 104e, 104f) of the current comparison circuit 304, gate oxide films of the P-channel MOS transistors 304a, 304b are thinner than those of the MOS transistors of the voltage-to-current conversion circuit 103. Variations in characteristics of the P-channel MOS transistors 304a, 304b are therefore smaller than those of the MOS transistors of the voltage-to-current conversion circuit 103.

When the ground voltage GND is being output as the comparison output from the current comparison circuit 304, a current flows between the drain and source of the P-channel MOS transistor 304a. A current is therefore less likely to flow between the drain and source of the P-channel MOS transistor 104c. Accordingly, the comparison output is less likely to transition to the voltage of the power supply Vddl.

When the voltage of the power supply Vddl is output as the comparison output, on the other hand, a current flows between the drain and source of the P-channel MOS transistor 304b. A current is therefore less likely to flow between the drain and source of the P-channel MOS transistor 104a. Accordingly, the comparison output is less likely to transition to the voltage of the ground GND.

According to the present embodiment, the current comparison circuit 304 having hysteresis characteristics is formed by MOS transistors having a thin gate oxide film. Variation in characteristics of the MOS transistors is therefore reduced, whereby the area can be reduced accordingly. Moreover, accurate hysteresis characteristics can be obtained with small-area transistors.

Note that the current comparison circuit 304 is not limited to the circuit shown in FIG. 7. The current comparison circuit 304 may have another circuit structure to implement the hysteresis characteristics, as long as the circuit is formed by MOS transistors having a thinner gate oxide film than that of the MOS transistors of the voltage-to-current conversion circuit 103.

In the comparator of the second embodiment, the current comparison circuit 104 may be replaced with the current comparison circuit 304 of the present embodiment.

Fourth Embodiment

Figure 8:
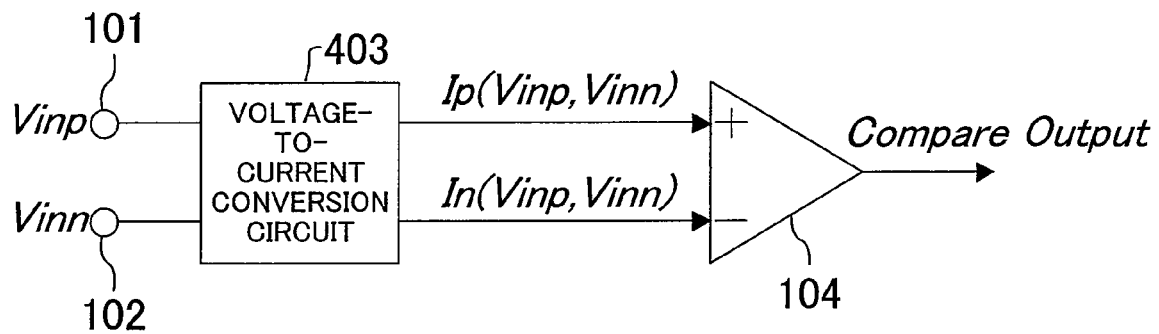
FIG. 8 is a circuit diagram showing a structure of a comparator according to a fourth embodiment.
Figure 9:
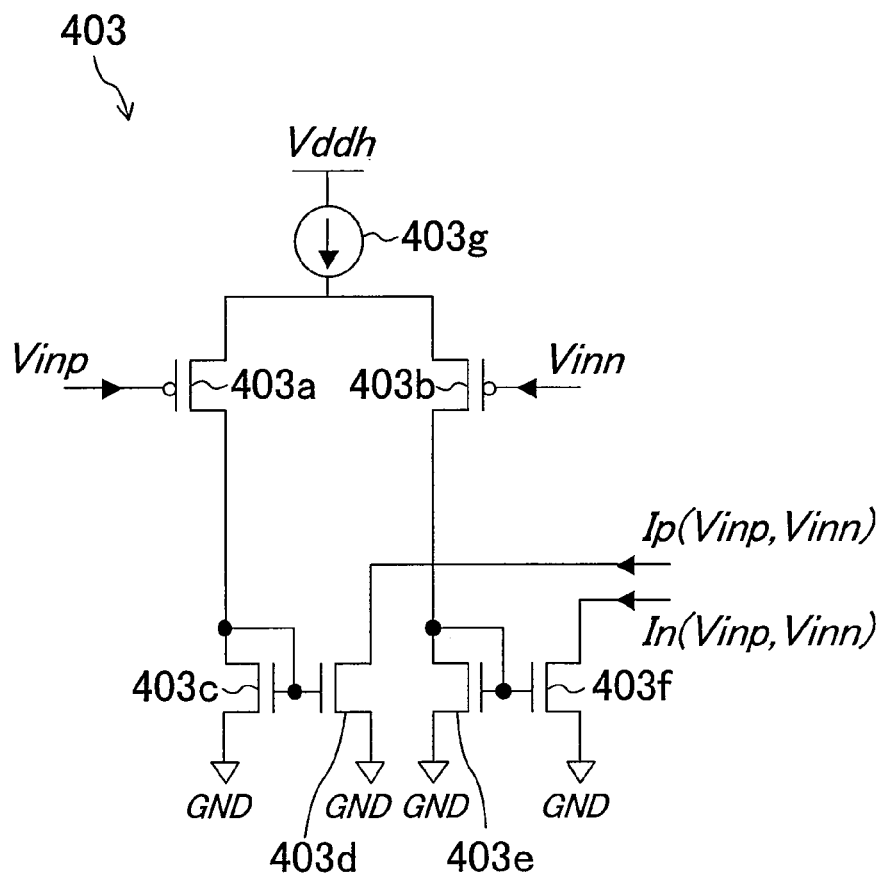
FIG. 9 is a circuit diagram showing a structure of a voltage-to-current conversion circuit 403 according to the fourth embodiment.

As shown in FIGS. 8 and 9, a comparator according to a fourth embodiment of the present invention includes a voltage-to-current conversion circuit 403 instead of the voltage-to-current conversion circuit 103 of the first embodiment. The voltage-to-current conversion circuit 403 converts the first and second voltages Vinp, Vinn to a first current Ip(Vinp, Vinn) and a second current In(Vinp, Vinn) according to the difference between the first voltage Vinp and the second voltage Vinn. The "first current" in the present invention is not limited to a current having a current value corresponding only to the first voltage, but includes a current having a current value corresponding both the first and second voltages, like the first current Ip(Vinp, Vinn) of this embodiment. Similarly, the "second current" in the present invention is not limited to a current having a current value corresponding only to the second voltage, but includes a current having a current value corresponding both the first and second voltages, like the second current In(Vinp, Vinn) of this embodiment.

In the voltage-to-current conversion circuit 403, a differential pair is formed by P-channel MOS transistors 403a and 403b that receive first and second voltages Vinp, Vinn, respectively. A current from a current source 403g is thus divided according to the first and second voltages Vinp, Vinn and flows between the drain and source of the P-channel MOS transistors 403a, 403b. Since N-channel MOS transistors 403c, 403d form a current mirror circuit, a current having the same value as that of the current flowing through the P-channel MOS transistor 403a flows through the N-channel MOS transistor 403d as the first current Ip(Vinp, Vinn). Since N-channel MOS transistors 403e, 403f form a current mirror circuit, a current having the same value as that of the current flowing through the P-channel MOS transistor 403b flows through the N-channel MOS transistor 403f as the second current In(Vinp, Vinn).

Like the voltage-to-current conversion circuit 103 of the first embodiment, the voltage-to-current conversion circuit 403 is also formed by MOS transistors having a thicker gate oxide film than that of the MOS transistors of the current comparison circuit 104.

Note that, in the present embodiment, the current comparison circuit 104 may be replaced with the current comparison circuit 304 of the third embodiment.

Fifth Embodiment

Figure 10:
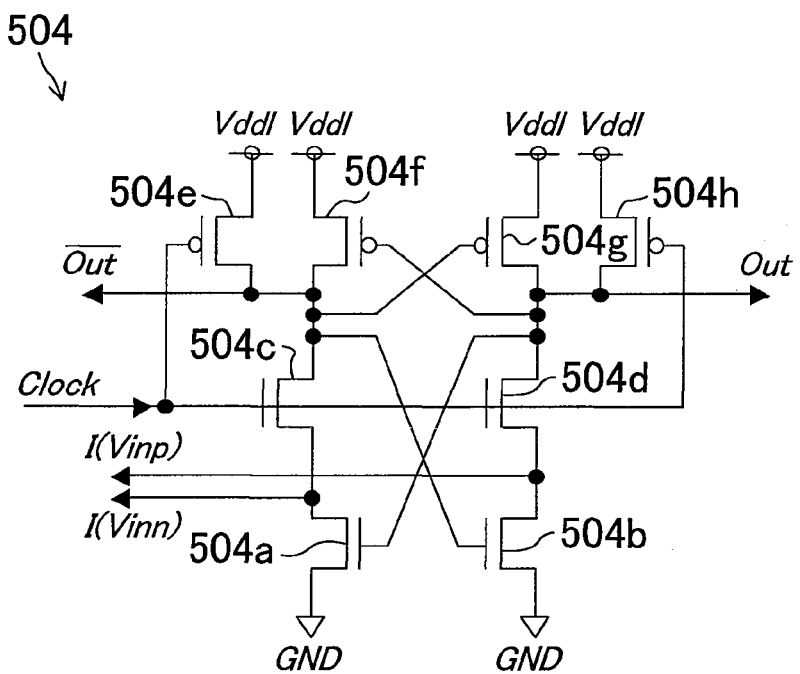
FIG. 10 is a circuit diagram showing a structure of a current comparison circuit 504 according to a fifth embodiment.

A comparator according to a fifth embodiment of the present invention includes a current comparison circuit 504 as shown in FIG. 10 instead of the current comparison circuit 104 of the first embodiment. A clock Clock is supplied to the current comparison circuit 504, and the current comparison circuit 504 compares the values of the first and second currents I(Vinp) and I(Vinn) in synchronization with the supplied clock Clock.

As shown in FIG. 10, the current comparison circuit 504 includes N-channel MOS transistors 504a, 504b, N-channel MOS transistors 504c, 504d, and P-channel MOS transistors 504e through 504h. The clock Clock is applied to the gates of the N-channel MOS transistors 504c, 504d.

Gate oxide films of the MOS transistors (the N-channel MOS transistors 504a through 504d and the P-channel MOS transistors 504e through 504h) of the current comparison circuit 504 are thinner than those of the MOS transistors of the voltage-to-current conversion circuit 103.

The comparator of the present embodiment can implement a clocked comparator that compares data in synchronization with a clock. A comparator having a large gain can thus be implemented with a small scale circuit.

Note that the current comparison circuit 504 is not limited to the circuit shown in FIG. 10. The current comparison circuit 504 may have another circuit structure to implement the function to compare the currents in synchronization with the clock Clock, as long as the circuit is formed by MOS transistors having a thinner gate oxide film than that of the MOS transistors of the voltage-to-current conversion circuit 103.

The current comparison circuit 504 may have hysteresis characteristics in the relation between the difference in current value between the first and second currents I(Vinp), I(Vinn) and the voltage (output voltage) to be output as the comparison result.

In the comparator of the second or fourth embodiment, the current comparison circuit 104 may be replaced with the current comparison circuit 504 of the present embodiment.

Sixth Embodiment

Figure 11:
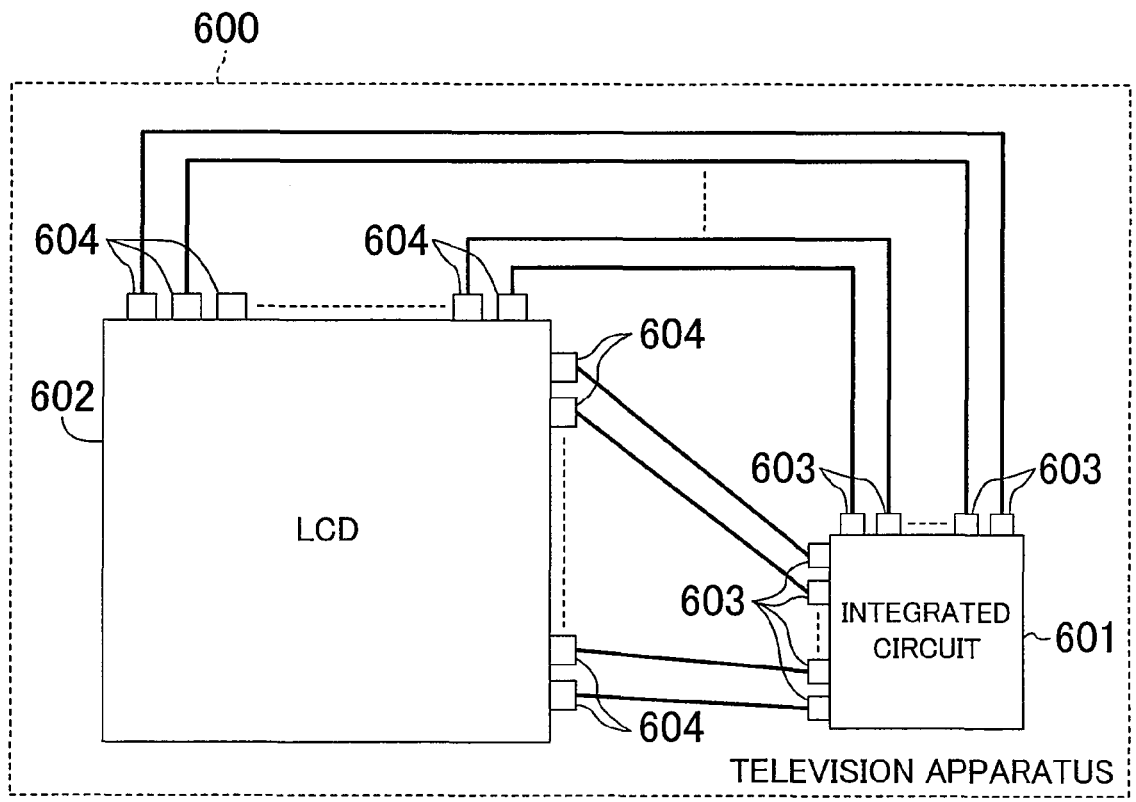
FIG. 11 is a block diagram showing a structure of a television apparatus according to a sixth embodiment.

As shown in FIG. 11, a television apparatus (electronic equipment) 600 according to a sixth embodiment of the present invention includes an integrated circuit 601 for generating a video signal based on a received signal received by a tuner, and an LCD (Liquid Crystal Display) 602 for displaying video image based on the video signal generated by the integrated circuit 601. The integrated circuit 601 has a plurality of transmission terminals 603 for transmitting a generated video signal. The LCD 602 has a plurality of reception terminals 604 for receiving the video signal transmitted by the transmission terminals 603.

Each transmission terminal 603 transmits a pair of electric signals having opposite phases to each other.

Each reception terminal 604 is formed by the comparator of the first embodiment. Each reception terminal 604 receives a pair of electric signals from a corresponding transmission terminal 603 as the first and second voltages Vinp, Vinn and compares the first and second voltages Vinp, Vinn.

Note that each reception terminal 604 is not limited to the comparator of the first embodiment, and may be formed by any of the comparators of the second through fifth embodiments.

Seventh Embodiment

Figure 12:
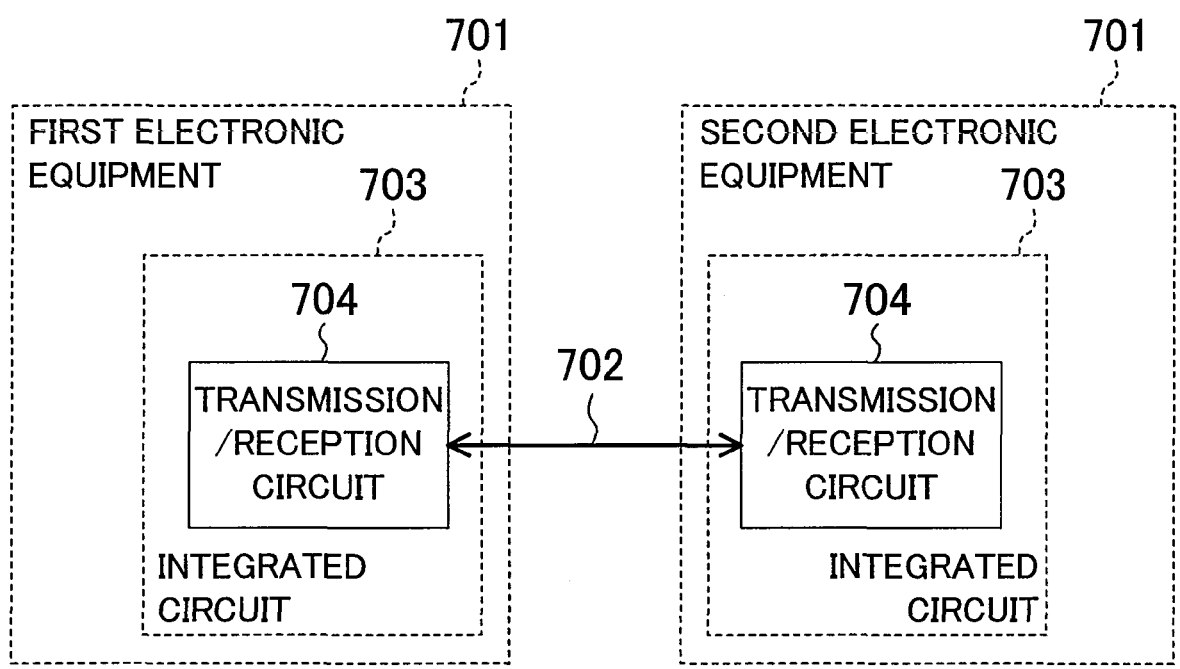
FIG. 12 is a block diagram showing a structure of a transmission/reception system according to a seventh embodiment.

As shown in FIG. 12, in a transmission/reception system according to a seventh embodiment of the present invention, first and second electronic equipments 701 are connected to each other through a cable 702. Each electronic equipment 701 includes an integrated circuit 703, and each integrated circuit 703 includes a transmission/reception circuit 704.

Each transmission/reception circuit 704 has a transmitting function to transmit a plurality of pairs of electric signals of opposite phases to the transmission/reception circuit 704 of the other integrated circuit 703, and a receiving function to receive the plurality of pairs of electric signals transmitted by the transmission/reception circuit 704 of the other integrated circuit 703 and compare the electric signals in each pair. Each transmission/reception circuit 704 includes the comparators of the first embodiment respectively corresponding to the plurality of pairs of electric signals. The above receiving function is implemented by these comparators.

Examples of the combination of the first and second electronic equipments 701 include: a hard disc and a personal computer; a hard disc and a DVD (Digital Versatile Disc) recorder; a television apparatus and a video cassette recorder; and a memory and a CPU (Central Processing Unit). In order to connect a hard disc with a personal computer or to connect a hard disc with a DVD recorder, the transmission/reception circuits 704 may be formed according to a Serial ATA (Serial Advanced Technology Attachment) standard. In order to connect a television apparatus with a video cassette recorder, the transmission/reception circuits 704 may be formed according to an HDMI (High-Definition Multimedia Interface) standard. By applying a reference voltage to one of the differential inputs, the transmission/reception circuits 704 may be used for connection between a memory and a CPU in, for example, a DDR (Double-Data-Rate) mode.

Note that the element performing the above receiving function in each transmission/reception circuit 704 is not limited to the comparator of the first embodiment. The comparators of the second through fifth embodiments may perform the receiving function in each transmission/reception circuit 704.

According to the present embodiment, power consumption in high speed operation of the comparator can be reduced. A high speed interface can therefore be used in equipments for which reduced power consumption is highly required.

Eighth Embodiment

Figure 13:
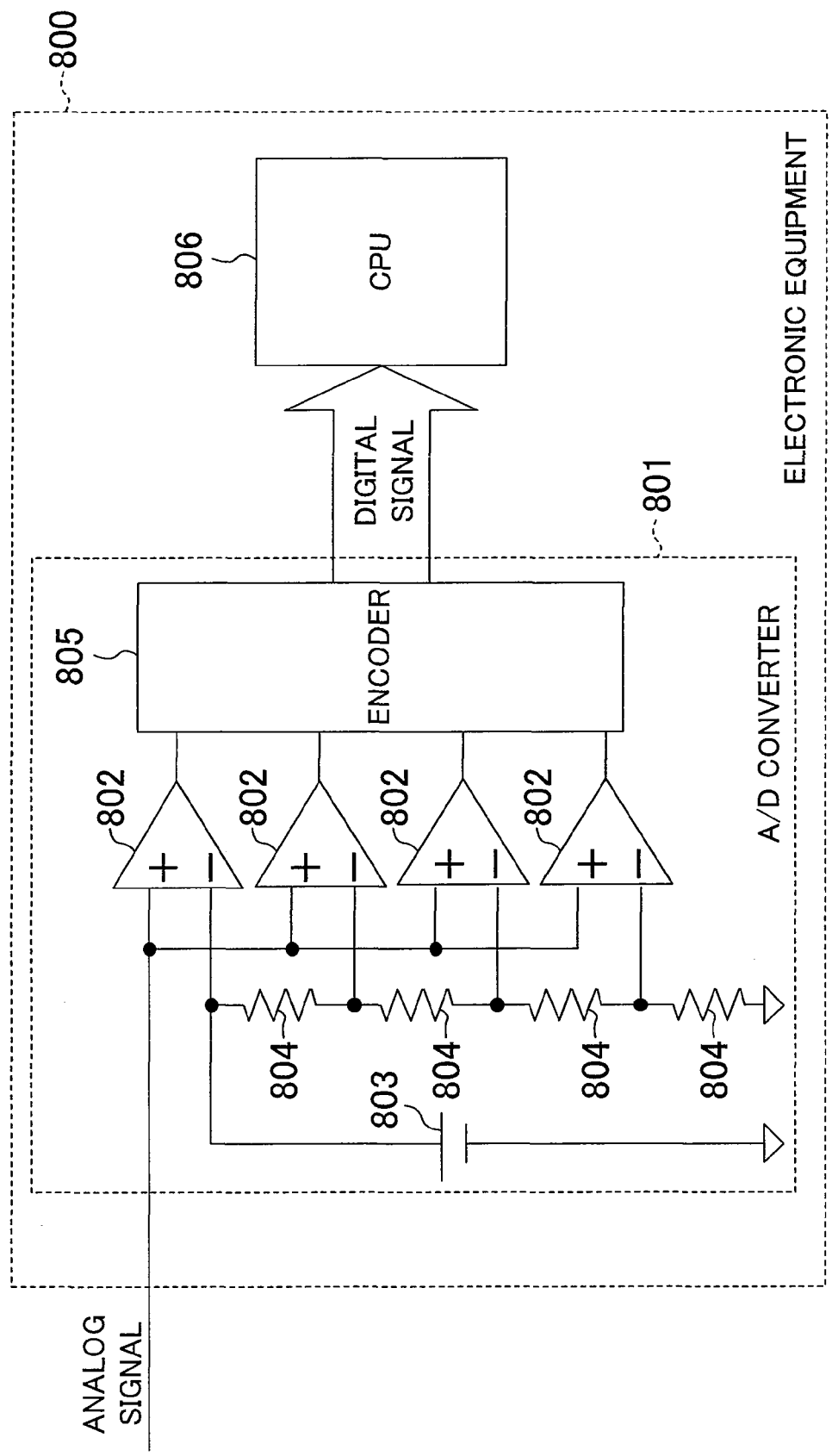
FIG. 13 is a circuit diagram showing a structure of an electronic equipment 800 according to an eighth embodiment.
Figure 14:
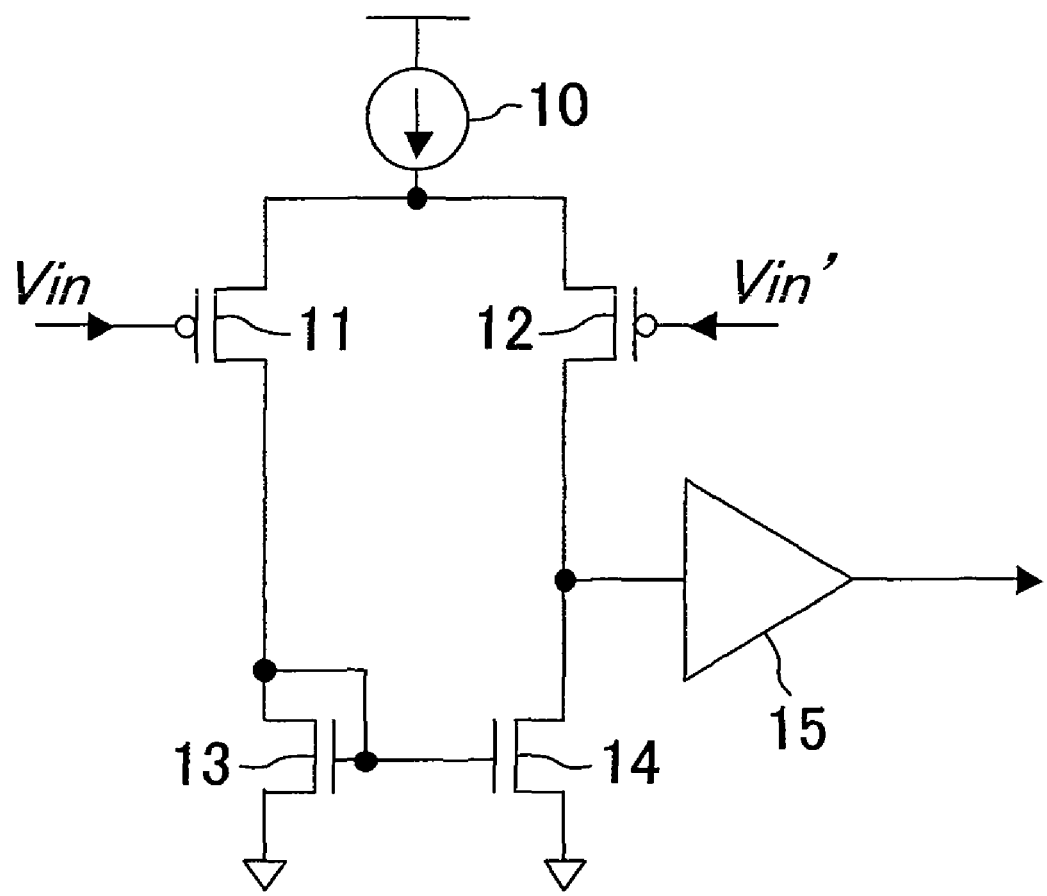
FIG. 14 is a circuit diagram showing a structure of a conventional comparator.

As shown in FIG. 13, an electronic equipment 800 according to an eighth embodiment of the invention includes an A/D (Analog-to-Digital) converter 801 and a CPU 806.

The A/D converter 801 includes four comparators 802, a power supply 803, four resistive elements 804, and an encoder 805.

Each comparator 802 is the comparator of the first embodiment. Each comparator 802 receives an input analog signal and a voltage at one end of a corresponding one of the resistive elements 804 as the first and second voltages Vinp, Vinn, and compares the first and second voltages Vinp, Vinn.

According to the present embodiment, the circuit area of the comparators mounted on a silicon wafer can be reduced as in the first embodiment. The size of the A/D converter 801 can therefore be reduced, thereby facilitating incorporation of the A/D converter 801 into the CPU 806. Incorporating the A/D converter 801 into the CPU 806 can reduce the number of parts of the electronic equipment 800.

Note that, although the 4-bit A/D converter 801 is described in the present embodiment, the present invention is not limited to this. The comparator of the first embodiment may be used in a 5-bit or more A/D converter. Using the comparator of the first embodiment in an A/D converter enables a high-speed multibit A/D converter to be formed by a small circuit.

Each comparator 802 is not limited to the comparator of the first embodiment and may be any of the comparators of the second through fifth embodiments.

According to the sixth through eighth embodiments, power consumption in high speed operation of the comparator can be reduced. Accordingly, when the electronic equipment is driven by a battery, the battery life (operating time) can be increased.

Note that the circuit structure of the voltage-to-current conversion circuit and the circuit structure of the current comparison circuit are not limited to those described in the above embodiments. The voltage-to-current conversion circuit and the current comparison circuit may have other circuit structures as long as oxide films of MOS transistors of the current comparison circuit are thinner than those of MOS transistors of the voltage-to-current conversion circuit.

As has been described above, the MOS integrated circuit and the electronic equipment including the MOS integrated circuit according to the present invention enables reduction in power consumption in high speed operation of the comparator. The MOS integrated circuit and the electronic equipment including the MOS integrated circuit according to the present invention are advantageously used for, for example, a reception circuit which is provided in an LSI (Large Scale Integration) having gate oxide films of a plurality of thicknesses provided on the same wafer, and which forms an interface for performing high speed signal transmission and reception to and from outside of the LSI.

What is claimed is:

1. A MOS integrated circuit for comparing respective voltage values of first and second voltages input from outside of an LSI including the MOS integrated circuit, comprising:
    a voltage-to-current conversion circuit configured to convert the first and second voltages to a first current having a current value corresponding to the first voltage and a second current having a current value corresponding to the second voltage; and
    a current comparison circuit configured to compare the respective current values of the first and second currents and to output a voltage showing the comparison result, wherein
    oxide films of MOS transistors of the current comparison circuit are thinner than oxide films of MOS transistors of the voltage-to-current conversion circuit.

2. The MOS integrated circuit of claim 1, wherein the voltage-to-current conversion circuit has variable conversion efficiency.

3. The MOS integrated circuit of claim 1, wherein the voltage-to-current conversion circuit is configured so that the conversion efficiency increases with increase in a frequency of the first and second voltages.

4. The MOS integrated circuit of claim 3, wherein, in the voltage-to-current conversion circuit, the frequency at which the conversion efficiency reaches a predetermined level is variable.

5. The MOS integrated circuit of claim 4, wherein in the voltage-to-current conversion circuit, an increase rate of the conversion efficiency with respect to the frequency is variable.

6. The MOS integrated circuit of claim 1, wherein a clock is supplied to the current comparison circuit, and the current comparison circuit compares the respective current values of the first and second currents in synchronization with the clock.

7. The MOS integrated circuit of claim 1, wherein the current comparison circuit has hysteresis characteristics in a relation between a difference in current value between the first and second currents and an output voltage.

8. An electronic equipment comprising the MOS integrated circuit of claim 1.

* * * * *